(12) United States Patent
Smith (10) Patent No.: US 8,820,948 B2
(45) Date of Patent: Sep. 2, 2014

(54) COMPOUND PARABOLIC COLLECTORS FOR PROJECTION LENS METROLOGY

(75) Inventor: Daniel Gene Smith, Tucson, AZ (US)

(73) Assignee: Nikon Corporation (JP)

( * ) Notice: Subject to any disclaimer, the term of this patent is extended or adjusted under 35 U.S.C. 154(b) by 160 days.

(21) Appl. No.: 13/309,526

(22) Filed: Dec. 1, 2011

(65) Prior Publication Data
US 2012/0140353 A1    Jun. 7, 2012

Related U.S. Application Data

(60) Provisional application No. 61/458,856, filed on Dec. 2, 2010.

(51) Int. Cl.
*G02B 5/10* (2006.01)
(52) U.S. Cl.
USPC .......................................... 359/853
(58) Field of Classification Search
CPC ........... F24J 2/12; G02B 5/10; G02B 27/0097
USPC .......................................... 359/838, 853, 868
See application file for complete search history.

(56) References Cited

U.S. PATENT DOCUMENTS

2011/0242515 A1 * 10/2011 Ceglio et al. .................. 359/350

\* cited by examiner

*Primary Examiner* — Euncha Cherry
(74) *Attorney, Agent, or Firm* — Yakov Sidorin; Quarles & Brady LLP; Lawrence R. Oremland (57) ABSTRACT

A new and useful optical element for an optical imaging system is provided, characterized in that the optical element comprises a reflecting surface that is rotationally symmetric and oriented at a grazing angle to a relatively small slit that is illuminated over a relatively large range of angles, such that the optical element collects radiation from the relatively small slit that is illuminated over a large range of angles, and the reflecting surface reflects the collected radiation. The optical element is configured to convert a large range of angles leaving a very small slit, to a much smaller range of angles over a larger area.

20 Claims, 6 Drawing Sheets

COMPOUND PARABOLIC COLLECTORS FOR PROJECTION LENS METROLOGY

RELATED APPLICATION/CLAIM OF PRIORITY

This application is related to and claims priority from provisional application Ser. No. 61/458,856, filed Dec. 2, 2010, which provisional application is incorporated by reference herein.

BACKGROUND

A current, known aerial image sensor (AIS) system senses an aerial image by projecting a slit from a reticle to a slit (referred to as the substrate side slit) on a metrology stage on the substrate-side of a projection lens. A collection lens (also referred to as a receiving lens) is used to collect the radiation leaving the substrate-side slit and relays it to a single detector element. As the substrate-side slit is scanned relative to the image of the reticle-side slit, certain information about the projection lens can be deduced from the detector signal.

One issue with the current MS system relates to its ability to collect radiation from the full numerical aperture (NA) of the system. Ideally the collection lens would be able to collect not only the entire NA, but also the majority of the radiation diffracted from the substrate-side slit. And, it is desirable that the collection lens be simple and reduced in weight—particularly if the collection lens were to be positioned on a substrate stage rather than a separate metrology stage, since any additionally bulk and weight could translate into a reduction in throughput by slowing the stage.

SUMMARY OF THE PRESENT INVENTION

The present invention seeks to provide a means of both reducing the weight and increasing the collecting aperture of a substrate-side collection lens, e.g. for an MS system or for another similar metrology system where non-imaging collection can be used. A basic concept of the present invention is to use a single rotationally symmetric optical element to convert the large range of angles leaving a relatively small slit, to a much smaller range of angles over a larger area. The rotationally symmetric optical element is a reflecting surface (preferably a single reflecting surface configured as a compound parabolic surface) that is rotationally symmetric and oriented at a grazing angle to collect nearly all the radiation from a relatively small slit illuminated over a large range of angles.

The resulting beam is, at the same time, delivered to a position several millimeters from the slit plane, where either a detector receives the radiation directly, or it is relayed with much simpler low-NA optics to a more remote detector.

In this application, reference to a "relatively small slit" means a slit on the order of a slit on a reticle in a lithographic imaging optical system (e.g. for imaging a substrate). Moreover, reference to the slit being illuminated over a "large range of angles" means a range of angles that would be associated with a lithographic imaging optical system having a numerical aperture (N.A.) on the order of about 1.3 or larger. The slit width could be on the order of up to 10 times the minimum resolvable line width for the lithographic imaging system. As an example, the present invention would be useful for an immersion type lithographic imaging system with an Argon Fluoride (ArF) light source, and with currently available immersion lithographic imaging systems the length of the slit would in the range of a hundred nanometers to a few microns. However, other sizes for the slit are certainly possible and are compatible with this invention.

It is well known in that a "compound parabolic concentrator" or CPC can be used to collect radiation over some range of angles and over some area and concentrate it down to a much smaller area, but over a larger range of angles. The present invention uses a compound parabolic collector that in a sense works in the opposite manner of a compound parabolic concentrator. Specifically, the present invention provides a rotationally symmetric optical element to convert the large range of angles leaving a relatively small slit, to a much smaller range of angles over a larger area. The rotationally symmetric optical element is a reflecting surface (preferably a single reflecting surface configured as a compound parabolic surface with an axis of symmetry and parabolic axis that are offset) that is rotationally symmetric and oriented at a grazing angle to collect nearly all the radiation from a relatively small slit illuminated over a large range of angles, and to deliver the radiation at a much smaller range of angles over a larger area.

Thus, in its most basic form, the present invention provides a new and useful optical element for an optical imaging system, characterized in that the optical element comprises a reflecting surface that is rotationally symmetric and oriented at a grazing angle to a relatively small slit that is illuminated over a relatively large range of angles, such that the optical element collects radiation from the relatively small slit that is illuminated over a large range of angles, and the reflecting surface reflects the collected radiation.

The optical element preferably has a reflecting surface that comprises a reflective compound parabolic surface. The optical element has an entrance region through which radiation enters the optical element and an exit region through which radiation leaves the optical element. The orientation of the optical element and the reflective compound parabolic surface relative to the slit, is such that the optical element receives radiation through the entrance region over a large range of angles, the radiation is reflected by the compound parabolic surface in a manner such that the radiation is delivered to the larger exit region at a relatively smaller range of angles. Thus, unlike a compound parabolic concentrator, which receives radiation through a relative large entrance area and concentrates the radiation at a relatively small exit area, the present invention, which is characterized as a compound parabolic collector, functions in an opposite way, i.e. it receives radiation through the relative small entrance region, over a relatively large range of angles, and delivers reflected radiation through the exit region, over a relatively smaller range of angles.

In addition, according to a preferred version of the present invention, a predetermined working distance is provided between the slit and the entrance region of the optical element. Moreover, this working distance can be filled by air or by some refractive (e.g. glass, crystal or liquid) component that extends between the optical element and the slit, where the refractive component has a thickness substantially equal to the predetermined working distance, such that radiation from the slit to the entrance region of the optical element is transmitted by the refractive component. Still further, a refractive surface may be provided at the exit region of the optical element to provide an additional degree of freedom in the optical design.

There are two currently preferred configurations for the optical element. In one version, the optical element comprises a solid component and the compound parabolic surface that reflects the radiation is provided is an internal surface of the solid optical element. The solid component has a curvature at the exit region of the optical element that provides the refractive surface at the exit region. In another version, the optical element comprises a hollow element with a central passage, and wherein the compound parabolic surface is provided as an inner surface of the hollow element. In that version, the refractive component is integrally connected with the hollow element.

Further features of the present invention will be apparent from the following detailed description and the accompanying drawings.

DETAILED DESCRIPTION

As described above, the present invention provides a new and useful optical element that is particularly useful in a metrology system such as an aerial image sensor (AIS) system. The present invention is described herein in connection with an AIS system, and from that description, the manner in which the present invention can be used with various types of metrology systems will be apparent to those in the art.

Figure 1:
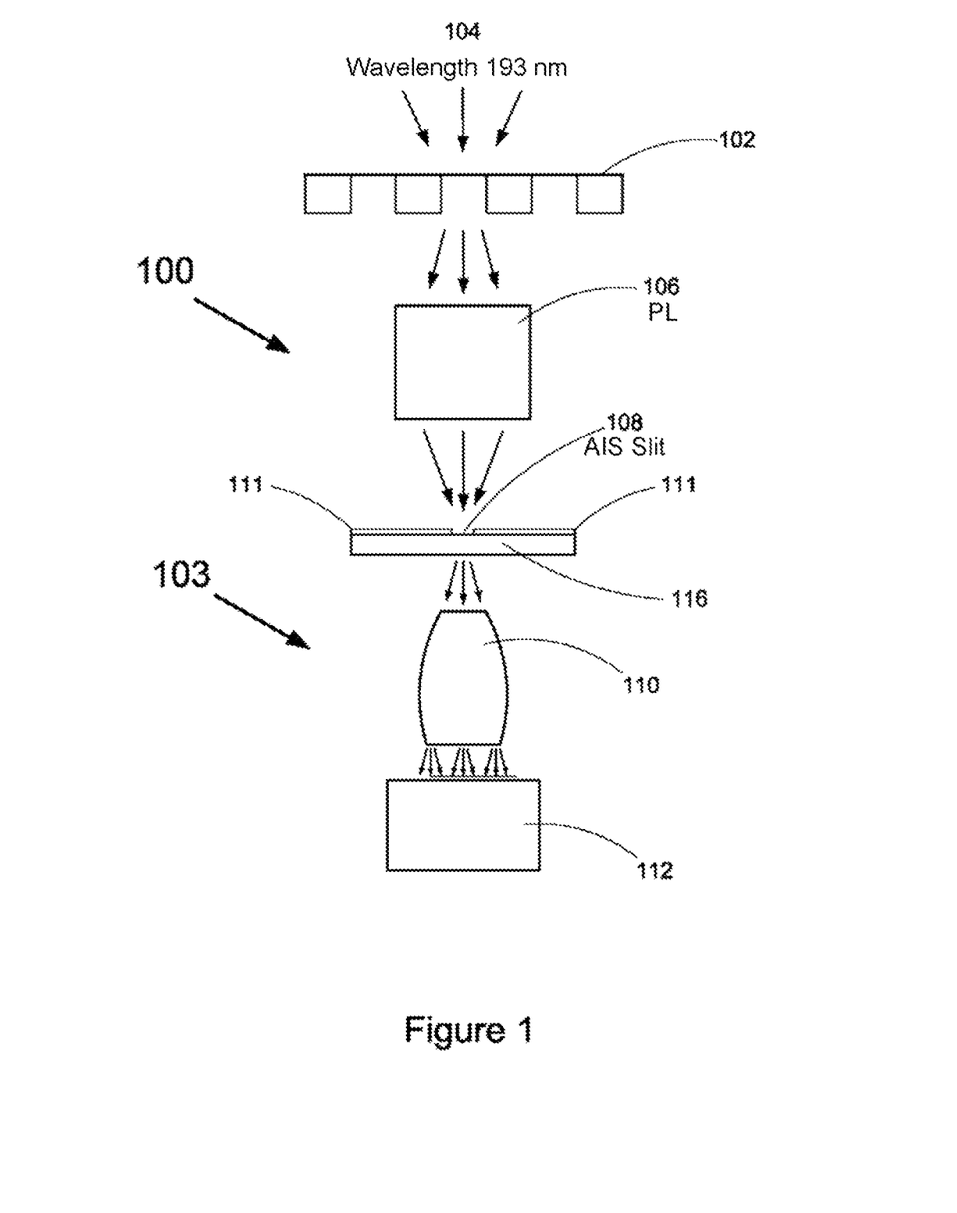
FIG. 1 is a schematic, exploded illustration of the basic components of a metrology system, e.g. an aerial image sensor (AIS) system, with which the present invention is particularly useful.

The present invention is particularly useful in an aerial image sensor (AIS) system of the type shown in FIG. 1. In a typical photolithographic image system, a mask (or reticle) has a pattern that is illuminated and projected to a substrate (e.g. a substrate for producing a semi conductor wafer). The image that is projected to the substrate is known as the "aerial image" or M. That aerial image would typically be a two dimensional image of a portion of an electronic circuit, which would be imaged onto photoresist on the substrate. The photoresist is then developed, to produce a pattern that is used in defining the electronic circuit on the substrate.

When the optical element of the present invention is used with an AIS system 100 of the type shown in FIG. 1, the mask 102 is illuminated by an optical scanner 100 that produces an aerial image The mask 102 would have a special pattern designed for the MS measurement, as would be recognized by those in the art. The scanner 100 can be designed, e.g. according to U.S. application Ser. No. 09/841,044, filed Apr. 25, 2001 (published as US published application 2002/0041377), which is incorporated herein by reference. The scanner 100 utilizes the mask or reticle 102 that is illuminated by a source 104 (e.g. an argon fluoride laser that produces light in the 193 nm wavelength range) and the image of the mask is directed by projection optics 106 (also referred to as projection lens PL) to produce the aerial image. The aerial image is then captured by an aerial image sensor (AIS) system that comprises e.g. a refracting component 116 with a slit 108 that is formed and bounded by a reflecting metal layer 111, relay optics that comprise the compound parabolic collector (or receiving lens) 110 of the present invention, and a detector 112 at which the energy passed by the slit is recorded. The refractive component 116 with the slit 108 are supported and positioned by a stage that is well known to those in the art.

Figure 2:
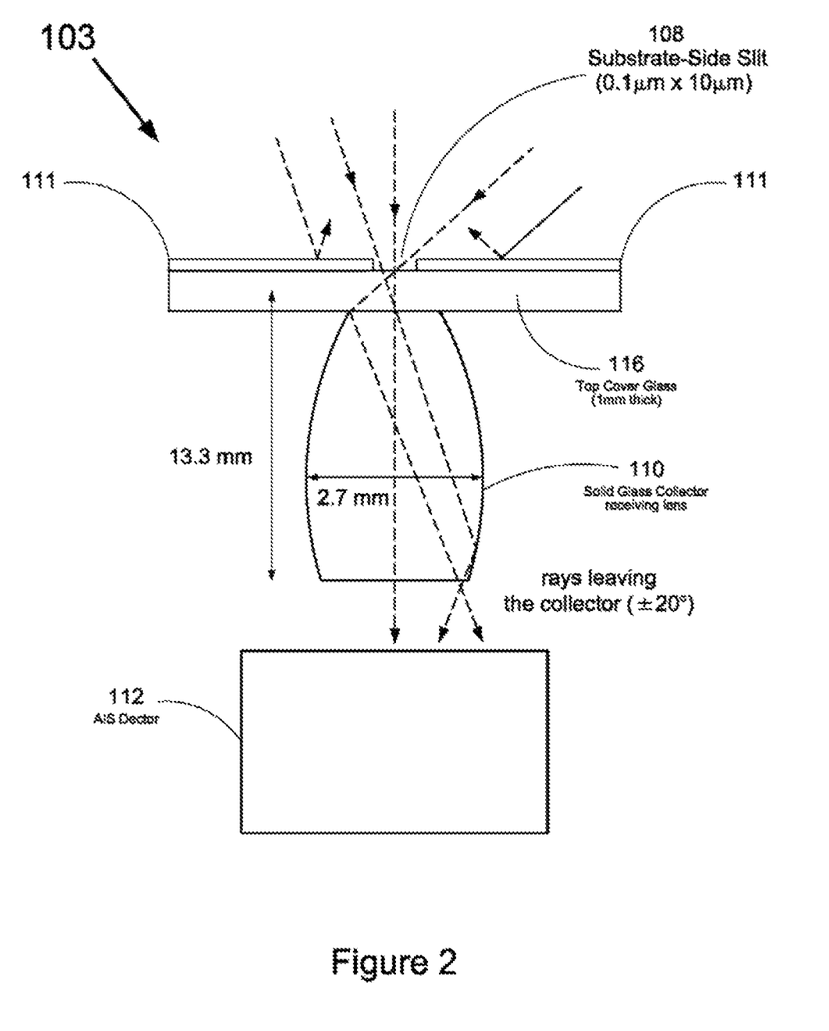
FIG. 2 is a schematic illustration of a compound parabolic collector oriented relative to a substrate slit of the MS system, according to the present invention, with some exemplary dimensions shown thereon.
Figure 3:
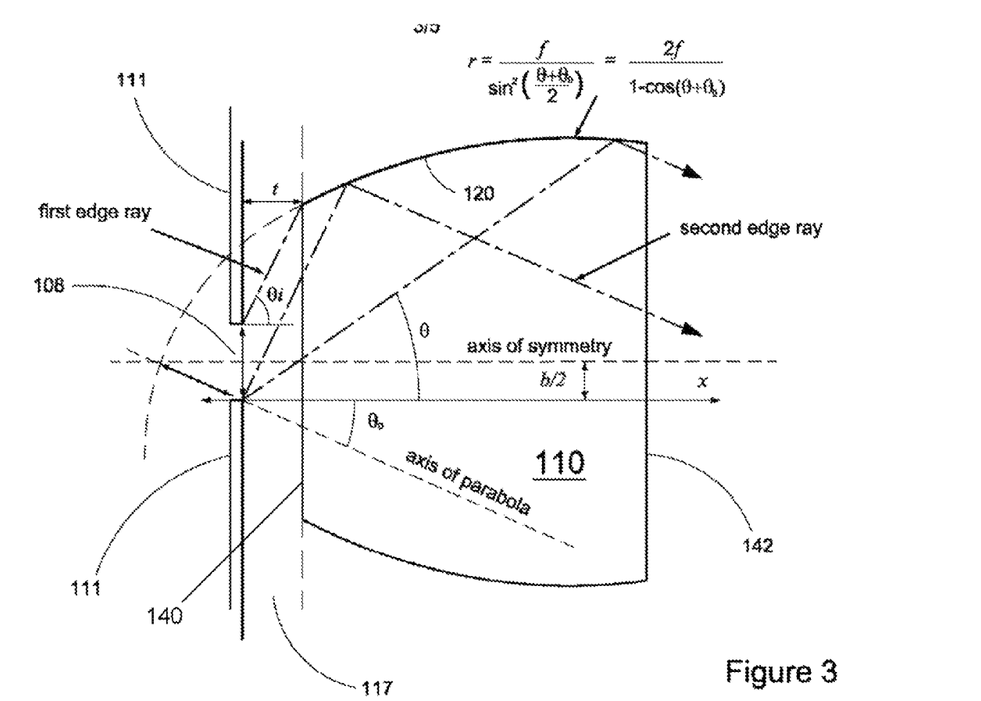
FIG. 3 is a schematic cross section of portions of the compound parabolic collector, showing the manner in which the compound parabolic collector is constructed and the manner in which radiation enters and exits the compound parabolic collector, and is internally reflected in the compound parabolic collector; in accordance with the present invention.
Figure 4:
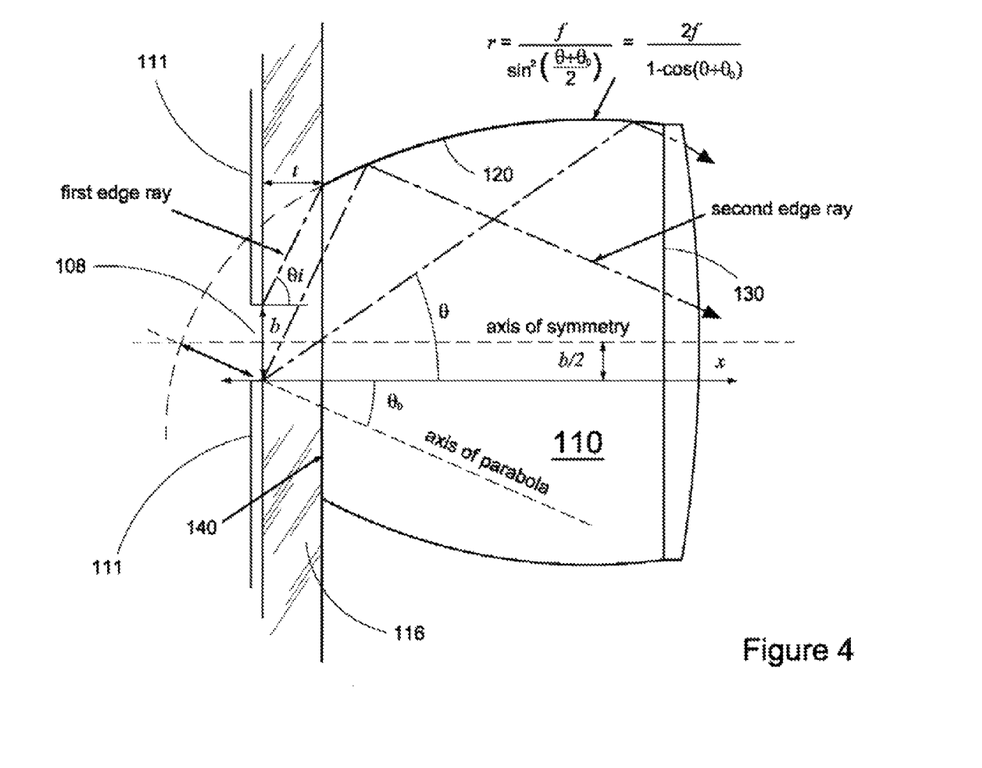
FIG. 4 is a schematic cross section of the compound parabolic collector according to one of the disclosed embodiments, and also showing a refracting element at the entrance region of the compound parabolic collector.

Referring to FIGS. 2-4, in one preferred version of the present invention, the compound parabolic collector 110 comprises a reflecting surface 120 that is rotationally symmetric and oriented at a grazing angle to the relatively small slit 108 that is illuminated over a relatively large range of angles, such that the compound parabolic collector 110 collects radiation from the relatively small slit that is illuminated over a large range of angles, and the reflecting surface 120 reflects the collected radiation.

The compound parabolic collector 110 has an entrance region 140 through which radiation enters the compound parabolic collector and an exit region 142 through which radiation leaves the compound parabolic collector, and the orientation of the compound parabolic collector and the reflective compound parabolic surface 120 relative to the slit 108, is such that the compound parabolic collector receives radiation through the entrance region 140 over a relatively large range of angles, the radiation is reflected by the compound parabolic surface 120 in a manner such that the radiation is delivered to the larger exit region 142 at a relatively smaller range of angles. Thus, unlike a compound parabolic concentrator, which receives radiation through a relative large entrance area and concentrates the radiation at a relatively small exit area, the present invention, which is characterized as compound parabolic collector 110, functions in an opposite way, i.e. it receives radiation through the relative small entrance region 140, over a relatively large range of angles, and delivers reflected radiation through the exit region 142, over a relatively smaller range of angles.

In addition, according to a preferred version of the present invention, a predetermined working distance (shown at "t" in FIGS. 3-5) is provided between the slit 108 and the entrance region 140 of the compound parabolic collector 110. That distance can be provided by the refracting element 116 (FIGS. 1, 2 and 4) which would have a thickness substantially equal to the predetermined working distance "t", such that radiation from the slit 108 to the entrance region 104 of the optical element is transmitted by the refractive surface. Alternatively, the predetermined working distance t can be an air gap 117 between the slit 108 and the entrance region of the optical element 110 (see FIG. 3). When the working distance is provided by the air gap 117, or as a liquid, the reflective metal layer 111 can be a separate element, or can be provided on a thin substrate.

The predetermined working distance "t" is desirable to provide a standoff between the compound parabolic collector 110 and the slit 108, which enables the compound parabolic collector 110 to collect substantially all radiation from the slit 108.

Still further, as also shown in FIG. 4, a refractive surface 130 may be provided at the exit region of the compound parabolic collector 110 (e.g. as a refractive component that is curved and integrally connected with the compound parabolic collector). In this application "integrally connected with" means a component that is (i) connected to the compound parabolic collector 110 such that the compound parabolic collector 110 and the component function as if they were a single piece or (ii) formed in one piece with the compound parabolic collector 110.

There are two currently preferred configurations for the optical element. In one version, shown in FIGS. 3 and 4, the compound parabolic collector 110 comprises a solid component and the compound parabolic surface 120 that reflects the radiation is provided is an internal surface of the solid optical component. Referring to FIG. 4, the refracting surface 130 at the exit region 142 of the solid component can be non-planar if desired.

Figure 5:
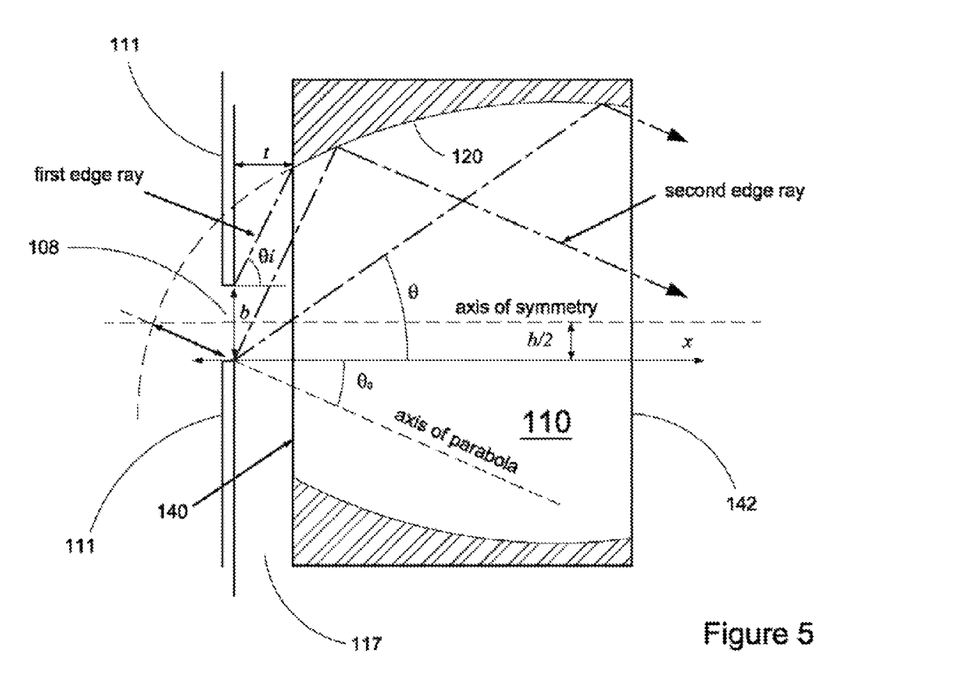
FIG. 5 is a schematic cross section of a modified version of the compound parabolic collector of the present invention.
Figure 6:
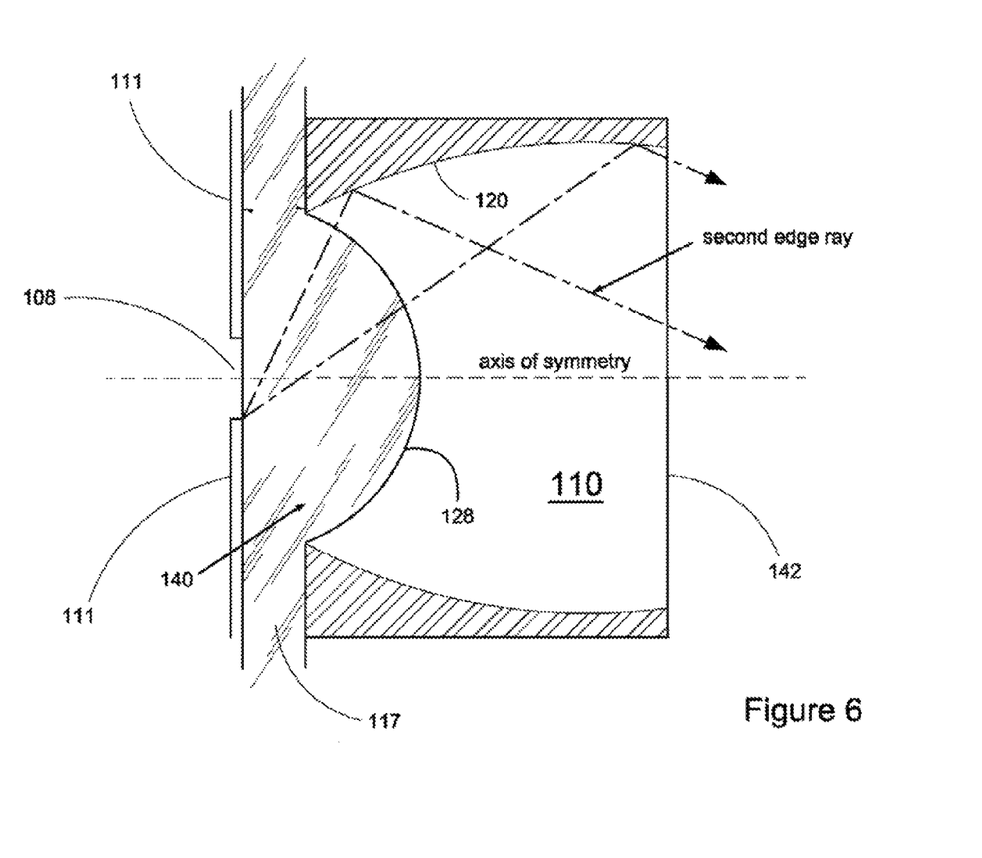
FIG. 6 is a schematic cross section of a modification of the compound parabolic collector of FIG. 5, according to the present invention.

In another version, shown in FIG. 5, the compound parabolic collector 110 comprises a hollow element 118 with a central opening 119, and the compound parabolic surface 120 is provided as an inner surface of the hollow element 118. In that version, the refractive component is integrally connected with the hollow element.

Geometric Construction of Basic Compound Parabolic Collector

FIGS. 2-6 illustrate the basic geometry of the compound parabolic collector, according to the present invention. The source slit 108 has a width b and is spaced by a working distance t from the leading edge of the reflecting surface 120 of the compound parabolic collector 110.

As further indicated in FIGS. 3-6, there are two edge rays. The basic construction of the compound parabolic concentrator (see for example *High Collection Nonimaging Optics*, by W. T. Welford and R. Winston, Academic Press 1989) also uses two edge rays in its construction, but the choice of edge rays is essentially different in the compound parabolic collector design of the present invention in several respects.

First, the compound parabolic collector 110 is tilted so that all rays leaving the bottom edge of the source are directed with an angle $\theta_0$ after reflection. This implies that the focal point of the parabolic profile on the top of the compound parabolic collector is centered on the opposite edge of the slit rather than the opposite edge of the reflective surface.

Second, the leading edge of the reflecting surface 120 (at the entrance regions 140 of the compound parabolic collector is defined by the "first edge ray". In this construction, the first edge ray leaves the top of the slit at the maximum angle, which is defined by the collection numerical aperture (NA). In our case, the slit is immersed in SiO2 (n=1.56) and the NA is, for example, 1.35, which leads to a ray angle of about 60 degrees. The leading edge is further defined by the working distance t, which is chosen based on available fabrication techniques to be as small as reasonably possible. Larger working distances tend to increase the diameter of the compound parabolic collector, but also produce a larger overall length such that the ratio of length/diameter tends to grow with larger working distances. Therefore it is generally preferred to have smaller working distances to reduce the size and mass of the compound parabolic collector.

Third, the trailing edge of the compound parabolic collector can be defined in several ways, but the method that optimally reduces the size of the exit beam uses the "second edge ray". The second edge ray, as shown in FIGS. 3-5, leaves one edge of the source and reflects off the opposite side of the compound parabolic collector, the eventual second intersection with the compound parabolic collector defines the exiting edge of the compound parabolic collector.

Derivation

It is useful to have several expressions for the shape of a parabola, for a compound parabolic collector according to the principles of the present invention. In the Cartesian coordinates of the figures, we can express the non-rotated parabola as, $$y = \frac{x^2}{4f} - f \tag{1a}$$

Or in polar form, including the possibility of rotation, $$r = \frac{f}{\sin^2\left(\frac{\theta + \theta_0}{2}\right)} = \frac{2f}{1 - \cos(\theta + \theta_0)} \tag{1b}$$

The Cartesian form (1a) is most useful when describing the surface in modeling software since this is the form usually expected.

In the remaining derivation, we will need to find the intersection of a ray, and the rotated parabola. To that end, we start with the equation of some line in slope intercept form.

$$y = mx + b \tag{2}$$

And then, replace x and y with their polar form, $$r\cos\theta = mr\sin\theta + b$$

Solving for r and substituting with (1b)

$$r = \frac{b}{\cos\theta - m\sin\theta} = \frac{2f}{1 - \cos\theta\cos\theta_0 + \sin\theta\sin\theta_0}$$

Or, $$b + \cos\theta(2fm - \cos\theta_0) = \sqrt{1 - \cos^2\theta}(2f - \sin\theta_0)$$

Then defining three new constants, A, B, and C, $$A = b$$

$$B = 2fm - \cos\theta_0$$

$$C = 2f - \sin\theta_0 \tag{3}$$

Our expression takes the form of, $$A + B\cos\theta = C\sqrt{1 - \cos^2\theta} \tag{4}$$

Squaring both sides of (4) gives the familiar quadratic form, from which we take our solution, $$\cos\theta = \frac{-AB + C\sqrt{-A^2 + B^2 + C^2}}{B^2 + C^2} \tag{5}$$

From this, if we have some ray that can be described by (2) we can find the intersection with (1b) using (3) and (5).

To find the leading edge of the compound parabolic collector, we take the first edge ray, $$m_1 = \tan\theta_i,$$

$$b_1 = b \tag{6}$$

The x and y positions of this edge are, $$x_{start} = \frac{2f\cos\theta_1}{1 - \cos(\theta_1 + \theta_0)}, \; y_{start} = \frac{2f\sin\theta_1}{1 - \cos(\theta_1 + \theta_0)} \tag{7}$$

Where $\theta_i$ is determined using (3), (5) and (6)

The case of the second edge ray, which defines the trailing edge of the compound parabolic collector, is complicated by the fact that it makes one reflection. So we start with its first segment, $$m_2 = \tan\theta_i$$

$$b_2 = 0 \qquad (8)$$

and calculate the first intersection point using (3), (5) and (8), $$x_2 = \frac{2f\cos\theta_2}{1-\cos(\theta_2+\theta_0)}, \, y_2 = \frac{2f\sin\theta_2}{1-\cos(\theta_2+\theta_0)} \qquad (9)$$

The construction sets the reflected ray slope, and from (7) we can obtain the y-intercept, $$m_2' = \tan\theta_0$$

$$b_2' = b - (y_1 - x_1 \tan\theta_0) \qquad (10)$$

From which we can obtain the x-y position of the final edge via (3), (5) and (10)

$$x_{end} = \frac{2f\cos\theta_2'}{1-\cos(\theta_2'+\theta_0)}, \, y_{end} = \frac{2f\sin\theta_2'}{1-\cos(\theta_2'+\theta_0)} \qquad (11)$$

Of course equations (7) and (11) give the coordinates of the edges in the Cartesian coordinates of the previous figure, but in some cases, we may want these positions in the coordinates of the parabola, where the x-axis follows the axis of the tilted parabola (the dashed line that goes through the focus). For this we have equations (12) and (13), where a hat is used to indicate that the positions are expressed in the coordinates of the parabola.

$$\hat{x}_{start} = \frac{2f\cos(\theta_1+\theta_0)}{1-\cos(\theta_1+\theta_0)}, \, \hat{y}_{start} = \frac{2f\sin(\theta_1+\theta_0)}{1-\cos(\theta_1+\theta_0)} \qquad (12)$$

$$\hat{x}_{end} = \frac{2f\cos(\theta_2'+\theta_0)}{1-\cos(\theta_2'+\theta_0)}, \, \hat{y}_{end} = \frac{2f\sin(\theta_2'+\theta_0)}{1-\cos(\theta_2'+\theta_0)} \qquad (13)$$

It turns out that the concentrator-type compound parabolic collector has its larger opening at the maximum diameter, but in the collector-type studied here, the exit is actually smaller than the maximum diameter. Welford and Winston derive this expression (or something close enough), so applicant refers the reader to them for the hints.

$$OD = \frac{2f}{\sin\theta_0} - b \qquad (14)$$

Additional Comments

In addition to a single reflecting surface 120 (that is preferably a compound parabolic surface), it is possible to employ refracting surfaces, e.g. as shown at 128, 130, in combination with the reflecting surface, as explained herein. Also the exit surface 130 of the compound parabolic collector can have a curvature that does not reduce the range of angles, but can reduce the spatial extent of the beam at the detector 112.

Another approach is to include a refracting surface before the hollow compound parabolic collector shown in FIG. 5. This would be similar to the refracting surface 128 shown in FIG. 6, and can allow for much shallower angles leaving the compound parabolic collector, but at the cost of complexity in the system.

As shown in FIGS. 3-6 and described above, the working distance t is defined by the thickness of a plate of glass (e.g. the plate 116 in FIG. 4). Where the compound parabolic collector 110 is a solid piece of glass (e.g. FIGS. 3, 4), the entrance surface of the compound parabolic collector may need to be bonded to the glass member 116 (unless it can be formed in one piece), and this could be achieved with optical contacting since the flatness requirement over such a small region should be achievable.

An alternative is to form and orient the compound parabolic collector reflecting surface 120 so that it extends all the way to the glass-water interface, and locate the slit 108 on the compound parabolic collector 110 entrance surface. In such a configuration, the compound parabolic collector will have to be surrounded by a faceplate that can support the water-body between the last element of the projection lens and the faceplate. A hole would be formed in the faceplate to receive the compound parabolic collector which would need to be silvered and cemented in place. The silvering is only necessary over the region that is used to seal the compound parabolic collector to the faceplate, since that is the region where the total internal reflection (TIR) condition will not be satisfied—however, it is possible to design the compound parabolic collector so that radiation is not incident on the reflective surface for some distance from the slit and in such cases silvering is not necessary.

In the foregoing description, the optical element (the compound parabolic collector 110) is described in connection with the aerial image sensor (AIS) system for measuring the aberration of the optical system to be examined (e.g. liquid immersion projection optical system). However, the invention is not limited to that application; there are a variety of modes of application of the optical element according to the invention. For example, the optical element of the present invention can be applied to an illuminance uniformity sensor (irradiation irregularity sensor) for measuring the illuminance uniformity (light amount distribution) of the exposure beam which has passed through the projection optical system and/or measuring the totalized light amount uniformity, and a radiation amount sensor (dose sensor) for measuring the radiation amount (light amount) of the exposure beam which has passed through the projection optical system.

In addition, it should be noted that according to the presention, the shape of the compound parabolic surface may be a shape slightly modified from the paraboloid of revolution.

Thus, the forgoing description provides a new and useful optical element for an optical imaging system, characterized in that the optical element comprises a reflecting surface that is rotationally symmetric and oriented at a grazing angle to much of the light leaving a relatively small slit that is illuminated over a relatively large range of angles, such that the optical element collects radiation from a relatively small slit that is illuminated over a large range of angles, and the reflecting surface reflects the collected radiation so that it leaves the optical element over a larger area and smaller range of angles. As will be appreciated by those in the art, this invention departs from the prior art in several ways. For example, the compound parabolic collector essentially reverses the compound parabolic concentrator making it a "compound parabolic collector"—gathering radiation over a large range of angles and a small region, and delivering it to a larger region and smaller range of angles. Another point of novelty is that it provides for cases where there is some working distance between the reflective (usually totally internally reflective) surface. Still another point of novelty is in the application to a projection lens metrology system.

With the foregoing description in mind, the manner in which the present invention can be applied to various types of projection lens metrology systems will be apparent to those in the art.

The invention claimed is:

1. An aerial image sensor (AIS) system for use in a photolithographic imaging system, the AIS system comprising:
    a first component of the AIS system having
        a slit in a surface of said first component, and
        an axis that is perpendicular to said surface,
        said first component transmitting radiation incident thereon through the slit to form first radiation; and
    a light collector of the AIS system disposed behind said first component at a working distance defining a gap between said light collector and said first component, said light collector having
        an entrance region bound by an entrance edge,
        an exit region bound by an exit edge, and
        a reflecting surface connecting the entrance and exit edges, said reflecting surface being rotationally symmetric about said axis and disposed at a grazing angle with respect to said slit such that the entrance region receives the first radiation within a first range of angles, said reflecting surface reflecting radiation received by the entrance region towards the exit region, and said exit region emits said radiation within a second range of angles.

2. An AIS system according to claim 1, wherein a maximum angle from the second range of angles is smaller than a maximum angle from the first range of angles.

3. An AIS system according to claim 2, wherein an area of the entrance region defined by the entrance edge is smaller than an area of the exit region defined by the exit edge.

4. An AIS system according to claim 1, wherein said reflecting surface is a compound parabolic surface and an internal surface of said light collector.

5. An AIS system according to claim 4, wherein an axis associated with said parabolic surface is tilted with respect to said axis of the first component of the AIS system.

6. An AIS system according to claim 1, wherein the working distance is defined such that radiation received by the entrance region within the first range of angles includes substantially all of the first radiation.

7. An AIS system according to claim 1, wherein the first component further includes a light-refracting element disposed to fill said gap.

8. An AIS system according to claim 7, wherein said light-refracting element has a first flat surface carrying thereon a reflecting metal layer that defines the slit, and a second curved surface that is in contact with the entrance edge.

9. An AIS system according to claim 1, wherein the light collector includes a hollow element in which said reflecting surface is an internal surface, a maximum diameter of a central passage of said hollow element being larger than a diameter of the exit region.

10. A photolithographic imaging system comprising an AIS system according to claim 1 and further comprising a projection lens operable to form, in transmission of light therethrough, an aerial image of a pre-determined pattern associated with the photolithographic imaging system on the surface of said first component.

11. An aerial image sensor (AIS) system for use in a photolithographic imaging system, the AIS system comprising:
    a first component of the AIS system having
        a slit in a surface of the first component, and
        a first axis that is perpendicular to said surface of the first component,
        said first component transmitting radiation incident thereon through the slit to form first radiation; and
    a light collector of the AIS system having a reflecting rotationally-symmetric compound parabolic surface that is an internal surface of said light collector and that defines and connects an entrance edge of the light collector and an exit edge of the light collector, said light collector being dimensioned such that, in operation, said light collector
        (i) receives at least a portion of the first radiation through an entrance area, bound by the entrance edge, within a first range of angles and
        ii) emits said at least a portion of the first radiation through an exit area, bound by the exit edge, within a second range of angles that is smaller than the first range of angles,
    said compound parabolic surface forming a grazing angle with the surface of said first component;
    said light collector disposed behind said first component at a working distance defining a gap therebetween.

12. An AIS system according to claim 11, wherein an axis of said compound parabolic surface is tilted by an angle $\theta_0$ with respect to the first axis, and wherein a position of the entrance edge is defined by Cartesian coordinates $$x_{start} = \frac{2f\cos\theta_i}{1-\cos(\theta_i+\theta_0)}, y_{start} = \frac{2f\sin\theta_i}{1-\cos(\theta_i+\theta_0)},$$

and wherein $\theta_i$ is a function of at least a width of the slit, a focal length f associated with said compound parabolic surface, and $\theta_0$.

13. An AIS system according to claim 11, wherein the working distance is defined such that radiation received by the entrance area within the first range of angles includes substantially all of the first radiation.

14. An AIS system according to claim 11, wherein the light collector includes a solid element in which said reflecting surface is an internal surface, and wherein a light-refracting surface corresponding to the exit area and bound by the exit edge is non-planar.

15. An AIS system according to claim 11, wherein the light collector includes a hollow element in which said reflecting surface is an internal surface, a maximum diameter of a central passage of said hollow element being larger than a diameter of the exit region.

16. An AIS system according to claim 11, wherein the first component further includes a light-refracting element disposed to fill said gap.

17. A photolithographic imaging system comprising an AIS system according to claim 11 and further comprising a projection lens operable to form, in transmission of light therethrough, an aerial image of a pre-determined pattern associated with the photolithographic imaging system on the surface of said first component.

18. A method for projecting light onto a target surface with a photolithographic system that includes an aerial image sensor (AIS) system, the method including
    transmitting light through an aperture formed in a light-blocking screen element to form first transmitted light;
    acquiring said first transmitted light, within a first range of spatial angles, by a light-pipe that is disposed behind the light-blocking screen and that is defined by a reflecting rotationally-symmetric compound parabolic surface, an entrance area bound by said compound parabolic surface, and an exit area bound by said compound parabolic surface; and channeling said light through a body of said light-pipe to emit said light through the exit area within a second range of spatial angles that is smaller than the first range of spatial angles.

19. A method according to claim 18, wherein said acquiring includes acquiring the first transmitted light through a refractive material disposed between the light-blocking screen element and the entrance area.

20. A method according to claim 18, wherein said channeling includes channeling said light to emit said light through a non-planar refractive surface of the exit area.

\* \* \* \* \*